United States Patent [19]

Jang

[11] Patent Number: 6,110,648
[45] Date of Patent: Aug. 29, 2000

[54] METHOD OF ENCLOSING COPPER CONDUCTOR IN A DUAL DAMASCENE PROCESS

[75] Inventor: Syun-Ming Jang, Hsin-Chu, Taiwan

[73] Assignee: Taiwan Semiconductor Manufacturing Company, Hsin-Chu, Taiwan

[21] Appl. No.: 09/156,058

[22] Filed: Sep. 17, 1998

[51] Int. Cl.$^7$ ...................................................... G03F 7/26
[52] U.S. Cl. .......................... 430/312; 430/314; 430/316; 430/317; 430/318
[58] Field of Search ...................... 430/313, 312, 430/316, 317, 394, 314, 318; 216/39, 47, 78; 438/618, 637, 622, 628, 634, 639

[56] References Cited

U.S. PATENT DOCUMENTS

| | | | |
|---|---|---|---|
| 5,091,339 | 2/1992 | Carey | 437/187 |
| 5,262,354 | 11/1993 | Cote et al. | 437/195 |
| 5,451,551 | 9/1995 | Krishnan et al. | 437/241 |
| 5,863,707 | 1/1999 | Lin | 430/313 |
| 5,935,762 | 8/1999 | Dai et al. | 430/312 |
| 6,004,188 | 12/1999 | Roy | 451/41 |
| 6,017,817 | 1/2000 | Chung et al. | 438/637 |

*Primary Examiner*—Christopher G. Young
*Assistant Examiner*—Saleha R. Mohamedulla
*Attorney, Agent, or Firm*—George O. Saile; Stephen B. Ackerman

[57] ABSTRACT

A method is disclosed for enclosing copper conductors in a protective material with the use of a modified dual damascene process. This is accomplished in a first embodiment where the dual damascene structure is formed first by forming either a via or contact hole and then a line trench. In the second embodiment, dual damascene copper interconnect is structured by first forming line trench pattern followed by hole pattern thus forming a composite hole and trench structure which is lined with a barrier material to accept copper metal which in turn is capped with a second barrier material in a cavity that is formed by a critical etch-back of the copper metal. It is shown that the method disclosed is applicable and useful to other trenching techniques and that the problems of corrosion and delamination through diffusion of copper are eliminated.

41 Claims, 3 Drawing Sheets

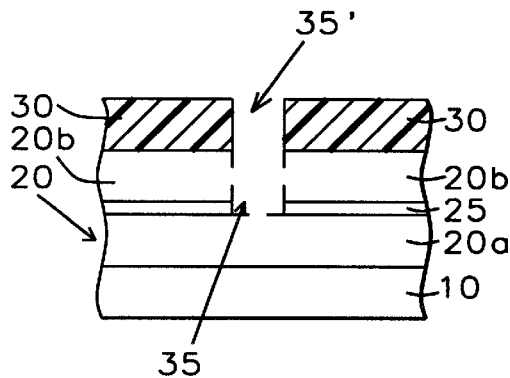
FIG. 1a – Prior Art
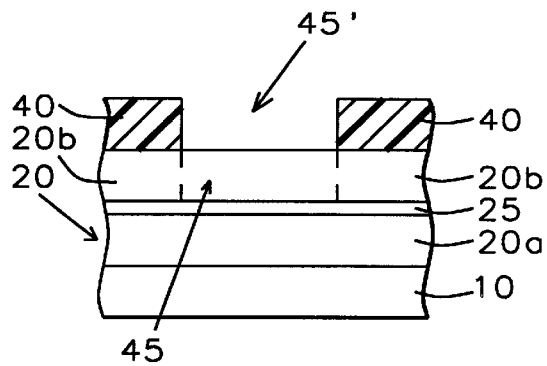
FIG. 2a – Prior Art
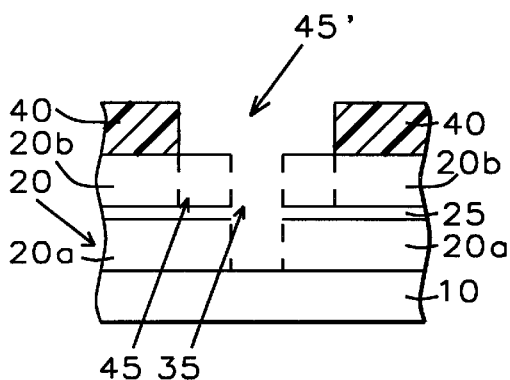
FIG. 1b – Prior Art
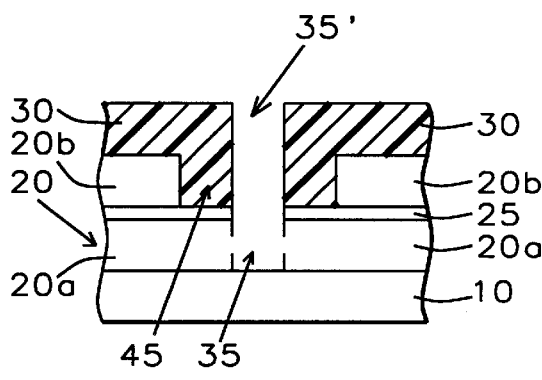
FIG. 2b – Prior Art
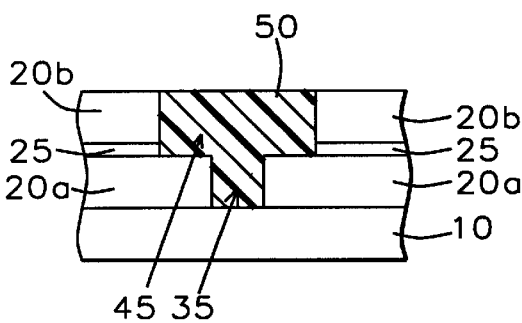
FIG. 1c – Prior Art
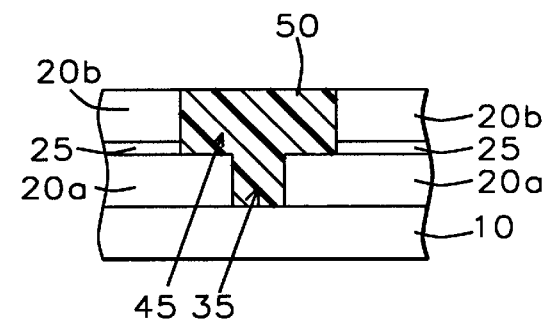
FIG. 2c – Prior Art

METHOD OF ENCLOSING COPPER CONDUCTOR IN A DUAL DAMASCENE PROCESS

BACKGROUND OF THE INVENTION (1) Field of the Invention

The present invention relates to the manufacture of ultra large scale integrated (ULSI) circuit chips in general, and in particular, to forming encased copper interconnects in a semiconductor substrate by using an improved damascene process.

(2) Description of the Related Art

It is the nature of semiconductor physics that as the feature sizes are scaled down, the performance of internal devices in integrated circuits improves in a compounded fashion. That is, the device speed as well as the functional capability improves. The overall circuit speed, however, becomes more dependent upon the propagation speed of the signals along the interconnects that connect the various devices together. With the advent of very and ultra large scale integration (VLSI and ULSI) circuits, it has therefore become even more important that the metal conductors that form the interconnections between devices as well as between circuits in a semiconductor have low resistivities for high signal propagation. Copper is often preferred for its low resistivity, as well as for resistance to electromigration and stress voiding properties. Unfortunately, however, copper suffers from high diffusivity in common insulating materials such as silicon oxide, and oxygen-containing polymers. This can cause corrosion of the copper with the attendant serious problems of loss of adhesion, delamination, voids, and ultimately a catastrophic failure of the circuitry. A copper diffusion barrier is therefore often required. A method of encasing copper conductors with a diffusion barrier is disclosed later in the embodiments of this invention.

Conventionally, the various metal interconnect layers in a semiconductor substrate are formed separately, and serially. First, a first blanket metal is deposited on a first insulating layer and electrical lines are formed by subtractive etching of the metal through a first mask. A second insulating layer is formed over the first metallized layer, and the second insulating layer is patterned with holes using a second mask. The holes are then filled with metal, thus forming metal columns, or plugs, contacting the first metal layer. A second blanket metal layer is formed over the second insulating layer containing the columnar plugs which now connect the upper second metal layer with the lower first metal layer. The second metal layer is next patterned with another mask to form a set of new electrical lines, and the process is repeated as many times as it is needed to fabricate a semiconductor substrate. It will be observed that patterning, that is, photolithography and etching of metal layers to form the needed interconnects constitute a significant portion of the process steps of manufacturing semiconductor substrates, and it is known that both photolithography and etching are complicated processes. It is desirable, therefore, to minimize such process steps, and dual damascene process provides such an approach. It will be shown later in the embodiments of this invention how such a dual damascene process is especially suited for forming copper interconnects.

In a single damascene process, grooves are formed in an insulating layer and filled with metal to form conductive lines. Dual damascene takes the process one step further in that, in addition to forming the grooves of a single damascene, the conductive hole openings are also formed in the insulating layer. The resulting composite structure of grooves and holes are filled with metal. The process is repeated as many times as required to form the multi-level interconnections between metal lines and the holes formed in between. Contact holes are formed directly over the substrate where the metal in the hole contacts the surface of the substrate, while the via holes are formed between metal layers.

In the standard dual damascene process an insulating layer, (20), shown in FIG. 1a, is coated with a resist material, (30), which is exposed to a first mask with the image pattern of a hole opening (35') for either a contact or via hole, and the pattern is anisotropically etched, (35), in the upper half (20b) of the insulating layer. The hole depth in the insulating layer can be controlled by timed-etch. That is, the etch is stopped after a predetermined period of time. However, timed-etch is not always reliable. In order to have a better control on the depth of the hole, an etch-stop layer is also be used, as is well known in the art. Etch-stop layer is usually a thin conformal material such as silicon nitride ($Si_3N_4$, SiN), silicon oxynitride ($SiO_xN_y$), or titanium nitride (TiN) which have high selectivity to the etchant. Thus, hole opening (35) in layer (20) stops at etch-stop layer (25) shown in FIG. 1a. The etchant is then modified to etch the hole pattern through the etch-stop layer and stop at the insulating layer below. After etching, patterned resist material (30) is removed, insulating layer (20) is coated with another resist material (40) and exposed to a second mask with image pattern of conductive lines (45') in alignment with hole openings (35) as shown in FIG. 1b. In anisotropically etching the openings for the conductive line in the upper half of the insulating material, the hole openings already present in the upper half are simultaneously etched in the lower half (20a) of the insulating material. After the etching is complete, both the hole openings and conductive line openings are filled with metal (50), and any excess material on the surface of the substrate is removed by chemical mechanical polishing as shown in FIG. 1c.

In another approach for the dual damascene process, the conductive line openings, (45'), are etched first into the upper half of the insulating material, (20b), as shown in FIG. 2a, using an etch-stop layer (25). Resist material, (30), is next formed over the substrate, thus filling the line opening (45), and patterned with hole opening (35'), as shown in FIG. 2b. The hole pattern is then etched into the lower half (20a) of the insulating material, thus forming the dual damascene structure. Again, after the etching is complete, both the hole openings and conductive line openings are filled with metal (50), and any excess material on the surface of the substrate is removed by chemical mechanical polishing as shown in FIG. 2c.

Other similar techniques such as trenching are also used for forming electrical interconnects. Carey, in U.S. Pat. No. 5,091,339, teaches the forming of conductor channels and vias using processes such as die stamping, etching, plating and polishing. Thus, he provides an insulating layer on a base, forming a channel in the top surface and partially through the thickness of the insulating layer, forming a via in the top surface and completely through the thickness of the insulating layer adjacent the channel, depositing an electrical conductor into the channel and via, and planarizing the interconnect top surface so that the electrically conductive layer remains only in the channel and via and is otherwise removed from the top surface of the insulating layer, and the interconnect top surface is substantially smooth, thereby forming an electrically conductive channel interconnected to an electrically conducting via.

Cote, et al., disclose the capping of low resistivity metal conductor lines with refractory metal in U.S. Pat. No. 5,262,354, where, first, a controlled amount of a soft, low resistivity metal is deposited in a trench or hole to a point below the top surface of the dielectric in which the trench or hole is formed. Subsequently, the low resistivity metal is overcoated with a hard metal such as CVD tungsten. Finally, chemical mechanical polishing is used to planarize the structure. According to Cote, et al., the hard metal cap serves the function of protecting the low resistivity metal from scratches and corrosion which would ordinarily be encountered if the low resistivity metal were subjected to the harsh chemical mechanical polishing slurries.

Krishnan, in U.S. Pat. No. 5,451,551, also discloses a multilevel metallization process using polishing along with a maskless process. Here, a first barrier layer is disposed in a recess in an insulating layer, a conductive metal is disposed on a the first barrier material such that the entire metal feature is positioned within the recess below the top of the recess, a second barrier material is disposed on the metal feature such that the second barrier material occupies the entire portion of the recess above the metal feature and extends above the top surface of the insulating layer, and the second barrier material is then polished until the top of the second barrier material is in and aligned with the top of the insulating layer. As a result, the metal feature is surrounded and protected by the first and second barrier materials, and the substrate is planarized.

Although prior art utilizes trenching or damascene techniques for forming interconnects, as well as techniques for protecting the same, especially the latter techniques are complex and complicated. For example, in U.S. Pat. No. 5,451,551, using chemical mechanical polishing to "attack and remove copper [in trenches] without removing . . . " the barrier layer from the surface of the substrate can be difficult. This is especially true when one takes into account the pattern dependency of dishing as is known in the art. Furthermore, two types of polishing slurry are required in polishing copper, and then the barrier material. Some of these problems are overcome in the present invention as disclosed below.

SUMMARY OF THE INVENTION

It is therefore an object of the present invention to provide a method of forming copper interconnects in a semiconductor substrate by using a damascene process.

It is another object of this invention to provide a method of enclosing copper conductors in a protective barrier in a damascene process.

These objects are accomplished by providing a semiconductor substrate having a substructure comprising devices formed in said substrate and a metal layer formed thereon; forming a lower level dielectric (LLD) layer over said substrate; forming an etch-stop layer over said LLD layer; forming an upper level dielectric (ULD) layer over said etch-stop layer; forming a first photoresist layer over said ULD layer; patterning said first photoresist layer with a hole pattern; etching through said hole pattern in said first photoresist layer into said ULD layer; etching further said hole pattern into said etch-stop layer; removing said first photoresist layer from said substrate; forming a second photoresist layer over said substrate including said hole pattern; patterning said second photoresist layer with a conductive line trench pattern; etching through said conductive line trench in said second photoresist layer into said ULD layer until etch-stop layer is reached; etching further and transferring said hole pattern from said ULD layer into said LLD layer until a lower level said substructure of said substrate is reached thus forming a composite hole and trench structure; removing said second photoresist layer; forming a first barrier layer on the walls, including the bottom wall, of said composite hole and trench structure; forming metal in said composite hole and trench structure covering said barrier layer; planarizing said metal; performing partial etch-back of said metal to form a cavity over said metal in said composite hole and trench structure; covering said substrate including said cavity with a second barrier layer; and removing said second barrier layer from surfaces of said substrate while leaving it in said cavity to encase said metal in said first and second barrier layers.

The objects of the invention are accomplished in a second embodiment where the dual damascene copper interconnect is structured by first forming line trench pattern followed by hole pattern thus forming a composite hole and trench structure which is lined with a barrier material to accept copper metal which in turn is capped with a second barrier material in a cavity that is formed by etch-back of the copper metal.

BRIEF DESCRIPTION OF THE DRAWINGS

In the drawings that follow, similar numerals are used referring to similar parts throughout the several views.

FIGS. 1a–1c show the forming of a dual damascene structure according to prior art.

FIGS. 2a–2c show the forming of a dual damascene structure according to another prior art.

DESCRIPTION OF THE PREFERRED EMBODIMENTS

Figure 3A:
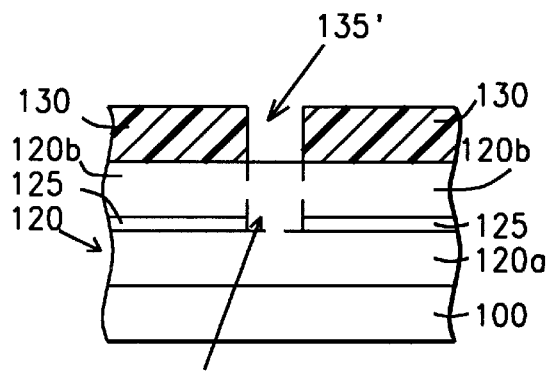
FIG. 3a is a cross-sectional view of a semiconductor substrate showing the patterning of a first resist layer with the image of either a via or contact hole pattern and the etching of the same in the upper layer dielectric as well as the in the etch-stop layer for the dual damascene structure of this invention.

Referring now the drawings, in particular to FIGS. 3a–3f, and FIGS. 4a–4f, there is shown a method of enclosing copper conductors in a protective barrier in a damascene process. Inasmuch as there are different types of damascene processes, it will be apparent to those skilled in the art that the two embodiments depicted in the drawings and disclosed in this invention will be applicable to any such damascene process.

The first embodiment shown in FIGS. 3a–3f is applicable to a dual damascene process where hole pattern is first formed in the insulating layers of substrate (100) having a substructure of devices and/or metal layer (not shown). As the substructure is not significant to the invention, it is not described in detail in order not to unnecessarily obscure the present invention.

In FIG. 3a, two layers of dielectric, a lower layer dielectric (LLD), (120a), and an upper layer (ULD), (120b), are formed with an intervening etch-stop layer (125). Usually, a dielectric layer is referred to as an interlevel dielectric (ILD) layer when formed over a semiconductor surface, such as silicon, and as an intermetal dielectric (IMD) layer when formed over a metal layer substructure. The present disclosure provides protection for copper conductors reaching either a semiconductor substructure exposed under a contact hole, or a metal substructure under a via hole, and therefore, the more general terms LLD and ULD will be used to distinguish the two layers of dielectric, and the term "hole" to refer to either contact or via holes.

Dielectric layers are known in the art. Both lower (LLD) and upper (ULD) layers shown in FIG. 3a may be formed from materials including but not limited to silicon oxide materials, silicon nitride materials, and silicon oxynitrides materials formed within integrated circuits through methods including but not limited do CVD, PECVD, PVD sputtering methods. For the preferred embodiment of the present invention, LLD layer (120a) comprises an oxide or a low-k (dielectric) polymer having a thickness between about 5000 to 8000 angstroms (Å), while ULD layer (120b) also comprises an oxide or low-k polymer, but with a thickness between about 5000 to 9000 Å.

Etch-stop layer (125) is a thin conformal material which can be silicon nitride ($Si_3N_4$, SiN), silicon oxynitride ($SiO_xN_y$), and titanium nitride (TiN). Silicon nitride is preferred for this embodiment because it has high selectivity to the etchant used in etching the dielectric layers. SiN is formed by reacting dichlorosilane ($SiCl_2H_2$) with ammonia ($NH_3$) in an PECVD at a pressure between about 1 to 5 torr, temperature between about 360 to 440° C. and at flow rates between about 50 to 100 standard cubic centimeters per minute (sccm), and with a thickness between about 500 to 1500 Å.

After the forming of LLD, ULD and etch-stop layer, a first photoresist layer (130) of a thickness between about 1.0 to 1.2 μm is formed and then patterned with a mask having either a via or contact hole pattern (135'), as shown in FIG. 3a. The hole pattern is next etched into the ULD and etch-stop layers as shown in FIG. 3a, forming hole (135) in respective layers (120b) and (125). It is preferred that the etching of ULD layer (120b) and etch-stop layer (125) is performed with recipe comprising gases $C_4F_8$, $CH_2F_2$ and Ar at flow rates between about 4 to 10 sccm, 5 to 15 sccm, and 50 to 150 sccm, respectively, and modified to etch stop layer (125) with gas $CH_3F$ at a flow rate between about 10 to 20 sccm. Subsequent to forming hole pattern (135) in the substrate as shown in FIG. 3a, first photoresist layer (130) is removed employing oxygen plasma ashing.

Figure 3D:
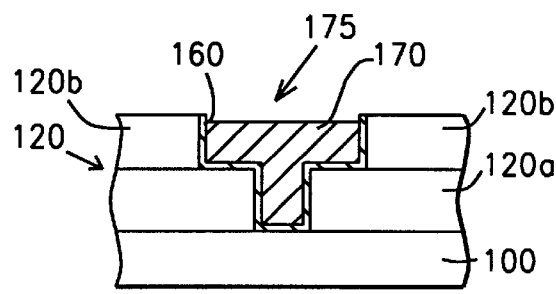
FIG. 3d shows the filling of the dual damascene structure of FIG. 3c with copper metal and the forming of a cavity by an etch-back process of this invention.
Figure 3B:
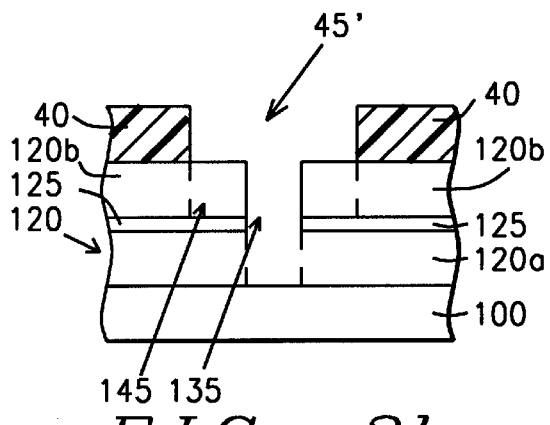
FIG. 3b shows the patterning of a second resist layer with the image of a line trench and the simultaneous etching of the trench in the upper level dielectric (ULD) layer and the transfer by etching of the hole pattern from the ULD layer into the lower level dielectric (LLD) layer, according to this invention.

Next, a second photoresist layer (140) is formed over the substrate including the previously formed hole pattern (135). The second photoresist layer is patterned with the image of a conductive line using a photomask, and the conductive line pattern is etched into ULD layer, (120b), as shown in FIG. (3b) to form conductive line trench (145). At the same time the conductive line trench is formed in ULD layer, hole pattern (135) is transferred, by the same etching process, into LLD layer (120a). It is preferred that the etching of the lower level dielectric layer is accomplished with recipe comprising gases $C_4F_8$, $CH_2F_2$ and Ar at flow rates between about 4 to 10 sccm, 5 to 15 sccm, and 50 to 150 sccm, respectively. Thus, a composite hole and trench damascene structure, shown with reference numeral (150) in FIG. 3c, is formed, after which the second photoresist layer is removed.

At the next step, and as a main feature and key aspect of the present invention, the walls of composite damascene structure (150), including the bottom wall, are covered with a barrier layer which will later serve as a protective encasement for the metal that will be formed within the walls of the composite damascene. It is important that the protective material be selected from a group of materials compatible with copper, that is, materials that will form a barrier to diffusion of copper into the dielectric layers surrounding the composite damascene structure. The preferred materials are tantalum (Ta), tantalum nitride (TaN), tungsten nitride and titanium nitride (TiN). In this embodiment, TaN/Ta composite (160) is deposited to a thickness between about 150 to 300 Å. The composite damascene structure is thus lined with TaN/Ta (160) as shown in FIG. 3c, though lining (160) can also be either TaN or Ta alone The barrier lined composite damascene structure of FIG. 3c is next filled with a conductive metal in general, but preferably with copper of this invention. Copper is then planarized by using the well known chemical mechanical polishing technique. As another key aspect of the instant invention, however, copper metal is next etched back so as to form a cavity, (175) as shown in FIG. 3d, by using wet-etch recipe comprising $HNO_3$ and $H_2O$. It will be noted that though reactive ion etch (RIE) may also be used, copper can be etched in a much better controlled manner using wet etch. However, the present practice in the manufacturing line shows that controlled removal of copper from a cavity or recess is very difficult if chemical mechanical polishing (CMP) is used. Furthermore, CMP is pattern sensitive, contributing to the unevenness of the depth of cavity (175) in other composite structures (not shown) in the body of the semiconductor substrate of FIG. 3d. Hence, according to the present invention, it is critical that etch-back, rather than CMP, is used to form cavity (175) shown in FIG. 3d.

Figure 3E:
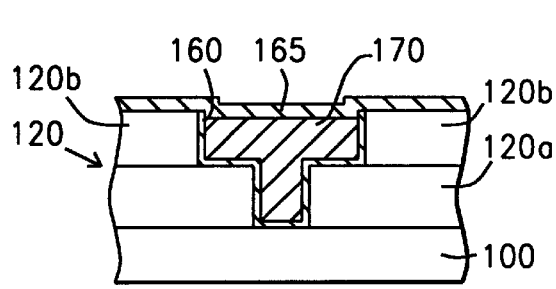
FIG. 3e shows the forming of a second barrier metal over the cavity of FIG. 3d, according to this invention.
Figure 3C:
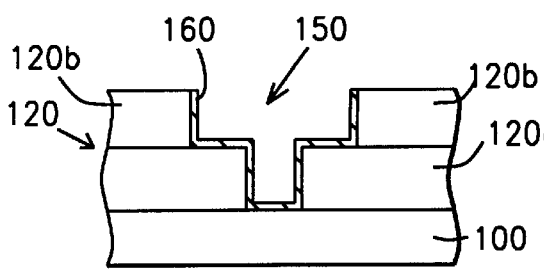
FIG. 3c shows the lining of the dual damascene structure of FIG. 3b with a first barrier metal according to this invention.
Figure 3F:
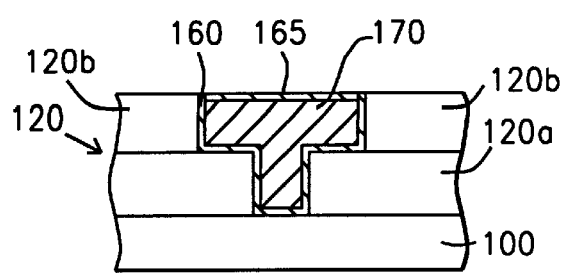
FIG. 3f shoes the forming of the dual damascene enclosed copper conductor of this invention by chemical mechanical polishing of the second barrier metal of FIG. 3e.

A second barrier metal is next formed over the cavity previously etched from copper metal (170) as shown in FIG. 3e. It is preferred that second barrier material (165) is also tantalum with a thickness between about 500 to 1000 Å, though it can be of any one of the other selected from a group consisting of tantalum nitride, titanium nitride or tungsten nitride. As a final step, any excess second barrier metal is removed by chemical mechanical polishing as shown in FIG. 3f. The resulting composite structure is a copper dual damascene interconnect encased in a barrier metal to protect the surrounding insulating material from the diffusion of copper and the attendant problems of corrosion and delamination.

The second embodiment shown in FIGS. 4a–4f also provides protection for a copper conductor formed with a dual damascene process where line trench pattern is first formed in the insulating layers of substrate (100) having a substructure of devices and/or metal layer (not shown). Similar reference numerals refer to similar elements shown in earlier FIGS. 3a–3f.

Figure 4A:
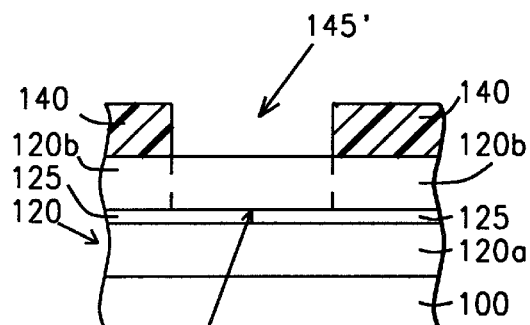
FIG. 4a is a cross-sectional view of a semiconductor substrate showing the patterning of a first resist layer with the image of a line trench and the etching of the same in the upper layer dielectric for the dual damascene structure of this invention.

In FIG. 4a, as in FIG. 3a, two layers of dielectric, a lower layer dielectric (LLD), (120a), and an upper layer (ULD), (120b), are formed with an intervening etch-stop layer (125). For the preferred embodiment of the present invention, LLD layer (120a) comprises undoped oxide, or low-k oxide, or low-k polymer having a thickness between about 5000 to 9000 angstroms (Å), and same with ULD layer (120b) with a thickness between about 5000 to 9000 Å. Etch-stop layer (125) shown in FIG. 4a is also a thin conformal material which can be silicon nitride ($Si_3N_4$, SiN) or silicon oxynitride ($SiO_xN_y$). Silicon nitride is preferred for this embodiment because it has high selectivity to the etchant used in etching the dielectric layers. SiN is formed by reacting dichlorosilane ($SiCl_2H_2$) with ammonia ($NH_3$) in an PECVD at a pressure between about 1 to 5 torr, temperature between about 360 to 440° C. and at flow rates between about 50 to 100 standard cubic centimeters per minute (sccm), and with a thickness between about 500 to 1500 Å.

After the forming of LLD, ULD and etch-stop layer, a first photoresist layer (140) of a thickness between about 1.0 to 1.2 Å is formed and then patterned with a mask having a hole pattern (145'), as shown in FIG. 4a. A line trench pattern is next etched into the ULD and etch-stop layers as shown in FIG. 4a, forming hole (145) in respective layers (120b) and (125). It is preferred that the etching of ULD layer (120b) and etch-stop layer (125) is performed with recipe comprising gases $C_4F_8$, $CH_2F_2$ and Ar at flow rates between about 4 to 10 sccm, 5 to 15 sccm, and 50 to 150 sccm, respectively. Subsequent to forming trench pattern (145) in the substrate as shown in FIG. 3a, first photoresist layer (140) is removed employing oxygen plasma ashing.

Figure 4D:
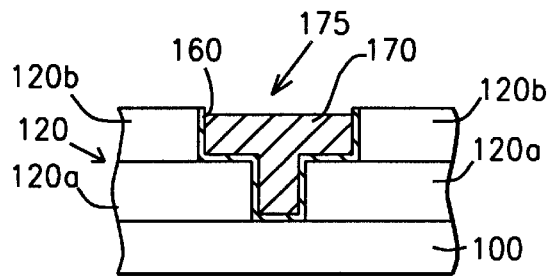
FIG. 4d shows the filling of the dual damascene structure of FIG. 4c with copper metal and the forming of a cavity by an etch-back process of this invention.
Figure 4B:
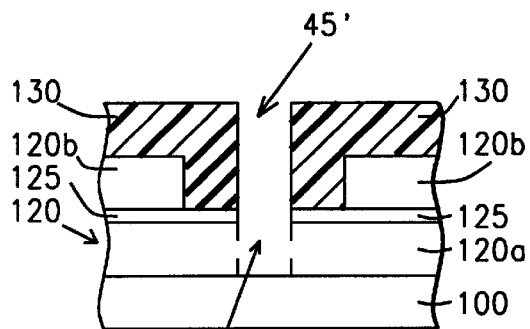
FIG. 4b shows the patterning of a second resist layer with the image of either a via or contact hole and the etching of the hole pattern in the etch-stop layer and the lower dielectric layer for the dual damascene structure of this invention.

Next, a second photoresist layer (130) is formed over the substrate including the previously formed trench pattern (145) as shown in FIG. 4b. The second photoresist layer is patterned with the image of either a contact or via hole pattern using a photomask, and the hole pattern is etched into LLD layer, (120a), as shown in FIG. (3b) to form hole pattern (135). It is preferred that the etching of the lower level dielectric layer is accomplished with recipe comprising gases $C_4F_8$, $CH_2F_2$ and Ar at flow rates between about 4 to 10 sccm, 5 to 15 sccm, and 50 to 150 sccm, respectively. Thus, a composite hole and trench damascene structure, shown with reference numeral (150) in FIG. 4c, is formed, after which the second photoresist layer is removed.

At the next step, and as a main feature and key aspect of the present embodiment also, the walls of composite damascene structure (150), including the bottom wall, are covered with a barrier layer which will later serve as a protective encasement for the metal that will be formed within the walls of the composite damascene. It is important to note again that the protective material be selected from a group of materials compatible with copper, that is, materials that will form a barrier to diffusion of copper into the dielectric layers surrounding the composite damascene structure. The preferred materials are tantalum, tantalum nitride, tungsten nitride and titanium nitride. In this embodiment, titanium nitride (160) is deposited to a thickness between about 150 to 300 Å. The composite damascene structure is thus lined with conformal titanium nitride (160) as shown in FIG. 4c.

Figure 4E:
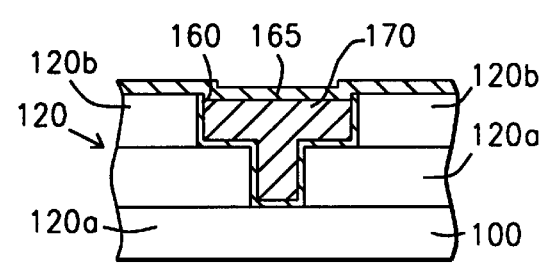
FIG. 4e shows the forming of a second barrier metal over the cavity of FIG. 4d, according to this invention.
Figure 4C:
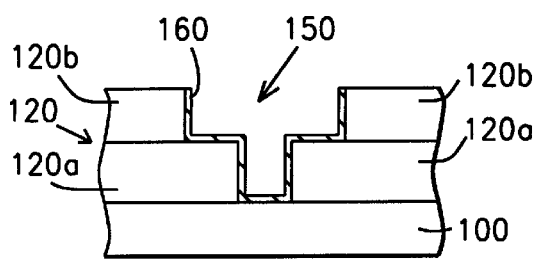
FIG. 4c shows the lining of the dual damascene structure of FIG. 4b with a first barrier metal according to this invention.

The barrier lined composite damascene structure of FIG. 4c is next filled with a conductive metal in general, but preferably with copper of this invention. Copper is then planarized by using the well known chemical mechanical polishing technique. As another key aspect of the instant invention, however, copper metal is next etched back so as to form a cavity, (175) as shown in FIG. 4d, by using wet-etch recipe comprising $HNO_3$ and $H_2O$. It will be noted that though reactive ion etch (RIE) may also be used, copper can be etched in a much better controlled manner using wet etch. However, the present practice in the manufacturing line shows that controlled removal of copper from a cavity or recess is very difficult if chemical mechanical polishing (CMP) is used. Furthermore, CMP is pattern sensitive, contributing to the unevenness of the depth of cavity (175) in other composite structures (not shown) in the body of the semiconductor substrate of FIG. 4d. Hence, according to the present invention, it is critical that etch-back, rather than CMP, is used to form cavity (175) shown in FIG. 4d.

Figure 4F:
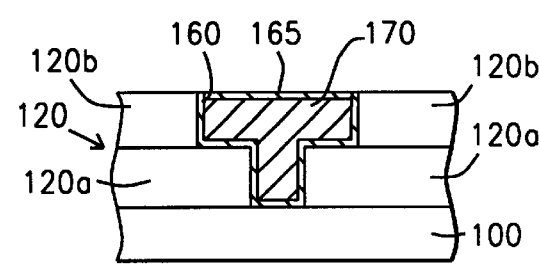
FIG. 4f shoes the forming of the dual damascene enclosed copper conductor of this invention by chemical mechanical polishing of the second barrier metal of FIG. 4e.

A second barrier metal is next formed over the cavity previously etched from copper metal (170) as shown in FIG. 4e. It is preferred that second barrier material (165) is also titanium nitride with a thickness between about 500 to 1000 Å, though it can be of any one of the other selected from a group consisting of tantalum, tantalum nitride or tungsten nitride. As a final step, any excess second barrier metal is removed by chemical mechanical polishing (CMP) as shown in FIG. 4f. The CMP is accomplished at a table speed between about 20 to 60 revolutions per minute (rpm) with a pad pressure between about 28 to 70 kiloPascals (kPa) and slurry flow rate between about 100 to 200 sccm. After the CMP, the remaining barrier metal assumes a thickness between about 150 to 300 Å. The resulting composite structure is again a copper dual damascene interconnect encased in a barrier metal to protect the surrounding insulating material from the diffusion of copper and the attendant problems of corrosion and delamination.

The enclosing of a metal conductor in a protective sleeve such as disclosed here is useful in other applications as well, where trenches are formed. Usually the key element is the final step of closing the encasement. It will be apparent to those skilled in the art the method disclosed here, namely, forming a cavity in a specific way in the conductor to be encased, to accept a lid or a cap, can be applied to other trenching techniques. At the same time, though numerous details were set forth above, such as specific materials, process parameter, etc., in order to provide an understanding of the present invention, exact details need not be employed to practice the present invention. Thus, one may also choose titanium nitride, TiN, as the preferred etch-stop material since it has a lower resistivity than the other etch barrier materials. It is also possible to omit the etch-stop layer altogether, by using timed-etch, when applied with the present invention.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of enclosing copper conductors in a protective barrier in a damascene process comprising the steps of:
   providing a semiconductor substrate having a substructure comprising devices formed in said substrate and a metal layer formed thereon;
   forming a lower level dielectric (LLD) layer over said substrate;
   forming an etch-stop layer over said LLD layer;
   forming an upper level dielectric (ULD) layer over said etch-stop layer;
   forming a first photoresist layer over said ULD layer;
   patterning said first photoresist layer with a hole pattern;
   etching through said hole pattern in said first photoresist layer into said ULD layer;
   etching further said hole pattern into said etch-stop layer;
   removing said first photoresist layer from said substrate;
   forming a second photoresist layer over said substrate including said hole pattern;
   patterning said second photoresist layer with a conductive line trench pattern;
   etching through said conductive line trench in said second photoresist layer into said ULD layer until etch-stop layer is reached;
   etching further and transferring said hole pattern from said ULD layer into said LLD layer until a lower level said substructure of said substrate is reached thus forming a composite hole and trench structure;
   removing said second photoresist layer;
   forming a first barrier layer on the walls, including the bottom wall, of said composite hole and trench structure;
   forming metal in said composite hole and trench structure covering said barrier layer;
   planarizing said metal;
   performing partial etch-back of said metal to form a cavity over said metal in said composite hole and trench structure;
   covering said substrate including said cavity with a second barrier layer; and
   removing said second barrier layer from surfaces of said substrate while leaving it in said cavity to encase said metal in said first and second barrier layers.

2. The method of claim 1, wherein said LLD layer comprises an oxide or a low-k polymer.

3. The method of claim 1, wherein said LLD layer has a thickness between about 5000 to 8000 Å.

4. The method of claim 1, wherein said forming an etch-stop layer over said LLD layer is accomplished by reacting dichlorosilane ($SiCl_2H_2$) with ammonia ($NH_3$) in an PECVD at a pressure between about 1 to 5 torr, temperature between about 360 to 440° C. and at flow rates between about 50 to 100 standard cubic centimeters per minute (sccm).

5. The method of claim 1, wherein said ULD layer comprises an oxide or a low-k polymer.

6. The method of claim 1, wherein said ULD layer has a thickness between about 500 to 9000 Å.

7. The method of claim 1, wherein said first photoresist layer over said ULD layer has a thickness between about 1.0 to 1.2 micrometers ($\mu$m).

8. The method of claim 1, wherein said patterning said first photoresist layer is accomplished with a photomask having said hole pattern.

9. The method of claim 1, wherein said etching through said hole pattern in said first photoresist layer into said ULD layer is accomplished with a recipe comprising gases $C_4F_8$, $CH_2F_2$ and Ar at flow rates between about 4 to 10 sccm, 5 to 15 sccm, and 50 to 150 sccm, respectively.

10. The method of claim 1, wherein said etching further said hole pattern into said etch-stop layer is accomplished with a recipe comprising gases $C_4F_8$, $CH_2F_2$ and Ar at flow rates between about 4 to 10 sccm, 5 to 15 sccm, and 50 to 150 sccm, respectively.

11. The method of claim 1, wherein said first photoresist layer is removed by oxygen plasma ashing.

12. The method of claim 1, wherein said patterning said second photoresist layer is accomplished with a photomask having said conductive line trench pattern.

13. The method of claim 1, wherein said etching through said conductive line trench in said second photoresist layer into said LLD layer until etch-stop layer is reached is accomplished with a recipe comprising gases $C_4F_8$, $CH_2F_2$ and Ar at flow rates between about 4 to 10 sccm, 5 to 15 sccm, and 50 to 150 sccm, respectively.

14. The method of claim 1, wherein said etching further and transferring from said ULD layer said hole pattern into said LLD layer until a lower level said substructure of said substrate is reached is accomplished with a recipe comprising gases $C_4F_8$, $CH_2F_2$ and Ar at flow rates between about 4 to 10 sccm, 5 to 15 sccm, and 50 to 150 sccm, respectively.

15. The method of claim 1, wherein said removing said second photoresist layer is accomplished with oxygen plasma ashing.

16. The method of claim 1, wherein said forming a first barrier layer on the walls, including the bottom wall, of said composite hole and trench structure is accomplished by depositing titanium nitride.

17. The method of claim 16, wherein said first barrier layer has a thickness between about 150 to 300 Å.

18. The method of claim 1, wherein said forming metal in said composite hole and trench structure covering said barrier layer is accomplished by depositing copper.

19. The method of claim 1, wherein said planarizing said metal is accomplished by chemical mechanical polishing.

20. The method of claim 1, wherein said performing partial etch-back of said metal to form a cavity over said metal in said composite hole and trench structure is accomplished by using a wet-etch recipe comprising $HNO_3$ and $H_2O$.

21. The method of claim 1, wherein said covering said substrate including said cavity with a second barrier layer is accomplished by depositing titanium nitride to a thickness between about 500 to 1000 Å.

22. The method of claim 1, wherein removing said second barrier layer from surfaces of said substrate while leaving it in said cavity to encase said metal in said first and second barrier layers is accomplished by chemical-mechanical polishing at a table speed between about 20 to 60 revolutions per minute (rpm) with a pad pressure between about 28 to 70 kiloPascals (kPa) and slurry flow rate between about 100 to 200 sccm.

23. A method of enclosing copper conductors in a protective barrier in a damascene process comprising the steps of:
   providing a semiconductor substrate having a substructure comprising devices formed in said substrate and a metal layer formed thereon;
   forming a lower level dielectric (LLD) layer over said substrate;
   forming an etch-stop layer over said LLD layer;

forming an upper level dielectric (ULD) layer over said etch-stop layer;

forming a first photoresist layer over said ULD layer;

patterning said first photoresist layer with a conductive line trench pattern;

etching through said conductive line trench pattern in said first photoresist layer into said ULD layer;

removing said first photoresist layer from said substrate;

forming a second photoresist layer over said substrate including said conductive line trench;

patterning said second photoresist layer with a hole pattern;

etching said hole pattern into said etch-stop layer;

etching further said hole pattern into said LLD layer until a lower level said substructure of said substrate is reached, thus forming a composite hole and trench structure;

removing said second photoresist layer;

forming a first barrier layer on the walls, including the bottom wall, of said composite hole and trench structure;

forming metal in said composite hole and trench structure covering said barrier layer;

planarizing said metal;

performing partial etch-back of said metal to form a cavity over said metal in said composite hole and trench structure;

covering said substrate including said cavity with a second barrier layer; and removing said second barrier layer from surfaces of said substrate while leaving it in said cavity to encase said metal in said first and second barrier layers.

24. The method of claim 23, wherein said LLD layer comprises an oxide or a low-k polymer.

25. The method of claim 23, wherein said LLD layer has a thickness between 5000 to 8000 Å.

26. The method of claim 23, wherein said forming an etch-stop layer over said LLD layer is accomplished by reacting dichlorosilane ($SiCl_2H_2$) with ammonia ($NH_3$) in an PECVD at a pressure between about 1 to 5 torr, temperature between about 360 to 440° C. and at flow rates between about 50 to 100 sccm.

27. The method of claim 23, wherein said ULD layer comprises an oxide or a low-k polymer.

28. The method of claim 23, wherein said ULD layer has a thickness between about 5000 to 9000 Å.

29. The method of claim 23, wherein said first photoresist layer over said ULD layer has a thickness between about 1.0 to 1.2 micrometers ($\mu$m).

30. The method of claim 23, wherein said patterning said first photoresist layer is accomplished with a photomask having said conductive line trench pattern.

31. The method of claim 23, wherein said etching through said conductive line trench pattern in said first photoresist layer into said ULD layer is accomplished with a recipe comprising gases $C_4F_8$, $CH_2F_2$ and Ar at flow rates between about 4 to 10 sccm, 5 to 15 sccm, and 50 to 150 sccm, respectively.

32. The method of claim 23, wherein said first photoresist layer is removed by oxygen plasma ashing.

33. The method of claim 23, wherein said patterning said second photoresist layer is accomplished with a photomask having said hole pattern.

34. The method of claim 23, wherein said etching said hole pattern into said etch-stop layer is accomplished with a recipe comprising gases $C_4F_8$, $CH_2F_2$ and Ar at flow rates between about 4 to 10 sccm, 5 to 15 sccm, and 50 to 150 sccm, respectively.

35. The method of claim 23, wherein said etching further said hole pattern into said LLD layer until a lower level said substructure of said substrate is reached is accomplished with a recipe comprising gases $C_4F_8$, $CH_2F_2$ and Ar at flow rates between about 4 to 10 sccm, 5 to 15 sccm, and 50 to 150 sccm, respectively.

36. The method of claim 23, wherein said forming a first barrier layer on the walls, including the bottom wall, of said composite hole and trench structure is accomplished by depositing titanium nitride to a thickness between about 150 to 300 Å.

37. The method of claim 23, wherein said forming metal in said composite hole and trench structure covering said barrier layer is accomplished by depositing copper.

38. The method of claim 23, wherein said planarizing said metal is accomplished with chemical mechanical polishing.

39. The method of claim 23, wherein said performing partial etch-back of said metal to form a cavity over said metal in said composite hole and trench structure is accomplished by using a wet-etch recipe comprising $HNO_3$ and $H_2O$.

40. The method of claim 23, wherein said covering said substrate including said cavity with a second barrier layer is accomplished by depositing titanium nitride to a thickness between about 500 to 1000 Å.

41. The method of claim 23, wherein said removing second barrier layer from surfaces of said substrate while leaving it in said cavity to encase said metal in said first and second barrier layers is accomplished by chemical-mechanical polishing at a table speed between about 20 to 60 revolutions per minute (rpm) with a pad pressure between about 28 to 70 kiloPascals (kPa) and slurry flow rate between about 100 to 200 sccm.

* * * * *